United States Patent
Chung

(10) Patent No.: US 7,046,067 B2
(45) Date of Patent: May 16, 2006

(54) THIN-OXIDE DEVICES FOR HIGH VOLTAGE I/O DRIVERS

(75) Inventor: Shien Chien Chung, San Jose, CA (US)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 11/127,452

(22) Filed: May 12, 2005

(65) Prior Publication Data

US 2005/0212558 A1  Sep. 29, 2005

Related U.S. Application Data

(63) Continuation-in-part of application No. 10/808,122, filed on Mar. 24, 2004.

(51) Int. Cl.
*H03L 5/00* (2006.01)
(52) U.S. Cl. .................................. 327/333; 327/112
(58) Field of Classification Search ................. 327/333
See application file for complete search history.

(56) References Cited

U.S. PATENT DOCUMENTS

| | | | | |
|---|---|---|---|---|
| 6,031,394 A * | 2/2000 | Cranford et al. | ............... | 326/81 |
| 6,054,888 A * | 4/2000 | Maley | ............... | 327/333 |
| 6,429,716 B1 * | 8/2002 | Drapkin et al. | ............... | 327/333 |
| 6,628,149 B1 * | 9/2003 | Ajit | ............... | 327/108 |
| 6,801,064 B1 * | 10/2004 | Hunt et al. | ............... | 327/112 |

* cited by examiner

*Primary Examiner*—My-Trang Nu Ton
(74) *Attorney, Agent, or Firm*—Preston Gates & Ellis LLP

(57) ABSTRACT

An I/O driver includes a pull-down module and pull-up module. The pull-down module has one or more NMOS transistors serially coupled between ground and an output node. The pull-up module has one or more PMOS transistors serially coupled between a first voltage and the output node. The gates of the PMOS and NMOS transistors are controlled by a set of differential biases for selectively pulling the output node to the first voltage or ground. The differential biases are separately set for each of the transistors so that a voltage difference across each of the transistors does not exceed a predetermined value, thereby preventing the same from damage.

5 Claims, 6 Drawing Sheets

THIN-OXIDE DEVICES FOR HIGH VOLTAGE I/O DRIVERS

CROSS REFERENCE

This Continuation-In-Part application claims the benefits of U.S. patent application Ser. No. 10/808,122, which was filed on Mar. 24, 2004 entitled "High Voltage CMOS Switch With Reduced High Voltage Junction Stresses."

BACKGROUND

The present invention relates generally to integrated circuit designs, and more particularly to high voltage input/output (I/O) drivers without using thick-oxide devices.

Semiconductor technology is evolving into the very deep sub-micron geometries of less than 100 nanometers (nm) to integrate more complex functionality at higher performance on a single chip. Sub-100 nm devices offer more complex functionality and higher performance, but not without a cost.

It has been observed that when a transistor channel length is small enough, current continues to flow even during standby states because of leakage. Therefore, the supply voltage must be scaled down accordingly to minimize such leakage. However, the I/O voltage for conventional I/O drivers still remains at a high voltage level, such as 3.3V or 2.5V, for compatibility with existing parts. Conventionally, thick-oxide devices are usually used for I/O drivers and thin-oxide devices are used for other circuits operating with the down-scaled supply voltage. The conventional I/O drivers using thick-oxide devices require additional masks during fabrication process, thereby making the process costly and time consuming. For example, it is typical that in order to include thick-oxide devices in semiconductor processing, four or five additional masks must be added to produce those devices. While there have been attempts to solve this issue, those attempts are either too complicated or limited for practical uses.

Desirable in the art of integrated circuit designs are designs that eliminate the need of using thick-oxide devices in high voltage I/O drivers.

SUMMARY

The invention discloses an input/output (I/O) driver operating as an I/O voltage. In one embodiment of the invention, the I/O driver includes a pull-down module and pull-up module. The pull-down module has one or more NMOS transistors serially coupled between ground and an output node. The pull-up module has one or more PMOS transistors serially coupled between a first voltage and the output node. The gates of the PMOS and NMOS transistors are controlled by a set of differential biases for selectively pulling the output node to the first voltage or ground. The differential biases are separately set for each of the transistors so that a voltage difference across each of the transistors does not exceed a predetermined value, thereby preventing the same from damage.

DESCRIPTION

Figure 1A:
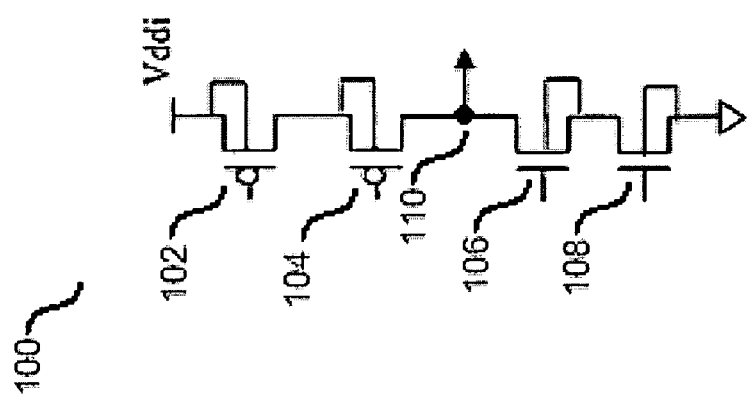
FIGS. 1A to 1C illustrate three I/O drivers with thin-oxide devices in accordance with one embodiment of the present invention.

FIG. 1A illustrates an I/O driver 100 with thin-oxide devices in accordance with one embodiment of the present invention. The I/O driver 100 is shown to be implemented with only thin-oxide devices. Thin-oxide PMOS transistors 102 and 104 are serially placed in a stack formation along with thin-oxide NMOS transistors 106 and 108 between an I/O power supply having an I/O voltage (VDDI) and ground. The transistors 106 and 108 collectively function as a pull-down module to pull the voltage at the output node 110 low. The transistors 102 and 104 collectively function as a pull-up module to pull the voltage at the output node 110 high. The I/O voltage (VDDI) is higher than a core voltage VDDC used for operation of a core circuitry (not shown in this figure). Proper differential biases are applied to the gates of the transistors to sustain the higher I/O voltage. These differential biases can be a fixed bias such as the core voltage VDDC, or a swing bias switching between a first voltage value and a second voltage value, depending on the needs of the driver's designs. If the swing bias switches with the same polarity as the output signal of the I/O driver, when the value of the output signal switches from zero to one, the swing bias switches from the low voltage value to the high voltage value. If the swing bias switches with the reversed polarity as the output signal of the I/O driver, when the value of the output signal switches from zero to one, the swing bias switches from the high voltage value to the low voltage value. Properly controlling the transistors with the various differential biases can make sure that a voltage difference across each of the PMOS transistors 102 and 104 does not exceed a predetermined value, which is set to keep the transistors operating normally without burning out due to an excessive voltage. This prevents the PMOS transistors 102 and 104 from damage which would have resulted from a high voltage difference there across due to the high I/O voltage VDDI.

The transistors 102 and 108 are configured as switches. Both gates of the transistors 104 and 106 are clamped to core voltage VDDC. The gate of transistor 108 is driven by a swing bias switching between 0V and the core voltage VDDC. The gate of transistor 102 is biased by a swing bias switching between the I/O voltage VDDI at the high end and the core voltage VDDC at the low end. When output at the output node 110 is to be logic 0, the I/O voltage VDDI is applied to the gate of transistor 102 for complete cutoff. When the output at the output node 110 is to be logic 1, the gate of the transistor 102 will be biased to VDDI−|Vtp| with a proper margin, where |Vtp| is the absolute threshold voltage value of the transistor 102. This turns on the transistor 102, and pulls the output node 110 high. With such proper biasing, the voltage drops across the transistors 102 and 104 would not exceed a predetermined value, thereby preventing the same from damage.

For example, in a design where the core voltage VDDC is 1.0V and the I/O voltage is 1.8V, the transistors 104 and 106 will be clamped by the core voltage VDDC of 1.0V. The gate of the transistor 102 will be biased to 1.8V when the output needs to be a logic 0. Assuming the threshold voltage of the transistor 102 is 0.4V, when the output needs to be a logic 1, the gate of the transistor 102 is biased to a voltage lower than 1.4V, such as 1.3V. With a proper bias applied to the gate of the transistor 102, only a fraction of the I/O voltage 1.8V will reach the source of the transistor 104. By controlling the bias, the voltage difference across the transistor 102 can be controlled under a predetermined value, thereby preventing the same from damage. Likewise, the voltage difference across the transistor 104 can be controlled under a predetermined value, thereby preventing the same from damage. Since both the transistors 102 and 104 are biased properly, high I/O voltage VDDI of 1.8V can be generated from the output node 110.

Figure 1B:
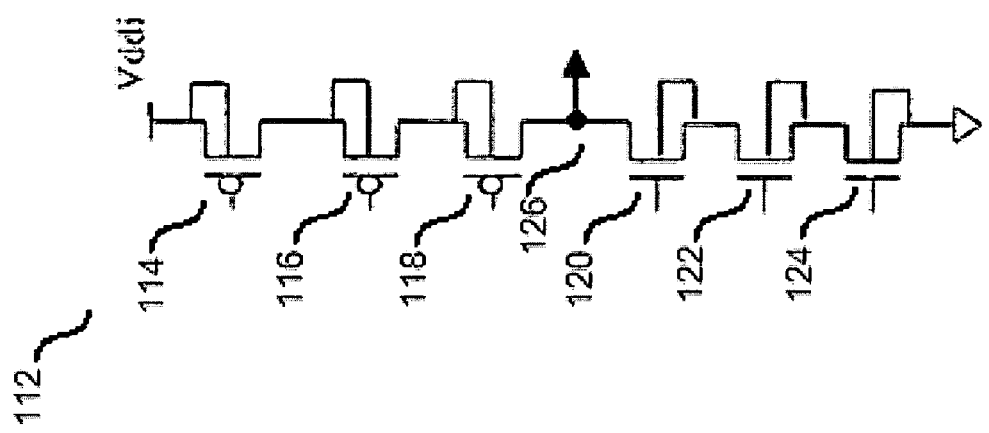

FIG. 1B illustrates an I/O driver 112 with thin-oxide devices in accordance with one embodiment of the present invention. Thin-oxide PMOS transistors 114, 116, and 118 are serially placed in a stack formation along with thin-oxide NMOS transistors 120, 122, and 124 between the I/O power supply having the I/O voltage VDDI and ground. The transistors 120, 122 and 124 collectively function as a pull-down module to pull the voltage at the output node 126 low. The transistors 114, 116 and 118 collectively function as a pull-up module to pull the voltage at the output node 126 high. Since there are more transistors placed in cascade formation in the I/O driver 112 than in the I/O driver 100, I/O voltage can be even higher. In other words, the number of the PMOS transistors in the pull-up module increases when the value of the I/O voltage increases. For example, if the I/O driver 100 can handle a high voltage of 1.8V, the I/O driver 112 will be able to handle an even higher voltage such as 2.5V. Proper differential biases are applied to the gates of each transistor to sustain the high I/O voltage. These gate voltages can be a fixed bias such as the core voltage VDDC, a swing bias switching with the same polarity as the output signal at the output node 126, or a swing bias switching with the reverse polarity as the output signal, depending on the needs of the driver's designs. The selective application of the three kinds of biases can be used to clamp the thin-oxide transistors within a safe operation region.

The transistors 114, 116, 118, and 124 are configured as switches. The I/O driver 112 functions similarly to the I/O driver 100, because both accept input and provide output in a higher voltage. As an example of the embodiment, when the output node 126 outputs the I/O voltage, the bias applied to the gate of the transistor 114 is set proximately equal to Vd+3|Vtp|, where Vd is a voltage drop across the transistor 114 and |Vtp| is the threshold voltage of the same. The biases applied to the gates of the transistors 116 and 118 are set proximately equal to VDDI−Vd−|Vtp|. When the output node 126 outputs 0V, the bias applied to the gate of the transistor 114 is set proximately equal to VDDI, the bias applied to the gate of the transistor 116 is set proximately equal to VDDI−Vd−|Vtp|, and the bias applied to the gate of the transistor 118 is set proximately equal to 2|Vtp|.

For example, in a design where the core voltage VDDC is 1.0V, the I/O voltage is 2.5V, the voltage drop across the transistor 114 is 0.7V, and the threshold voltage of the same is 0.4V, the devices within the I/O driver 112 are biased by a set of differential biases. The gate of the transistor 114 can be biased to 2.5V when output needs to be logic 0, and 1.9V when output is to be a logic 1. When the output is to be a logic 0, with the bias of the transistor 114 and a voltage drop there across, only 1.8V will reach the source of the transistor 116, thereby preventing the transistor 114 from damage. The transistor 116 is biased to 1.4V whether the output is a logic 0 or 1. After another voltage drop, only 1.2V can reach the source of the transistor 118, thereby preventing the transistor 116 from damage. The gate of the transistor 118 is biased to 0.8V when output needs to be logic 0 and 1.4V when output is to be a logic 1. With the transistors 114, 116, and 118 biased properly the voltage differences across the PMOS transistors are controlled within a safe range. To avoid high voltage damage, the transistors in the pull-down module of the I/O driver 112 are also properly biased according to the values of the output signals.

Figure 1C:
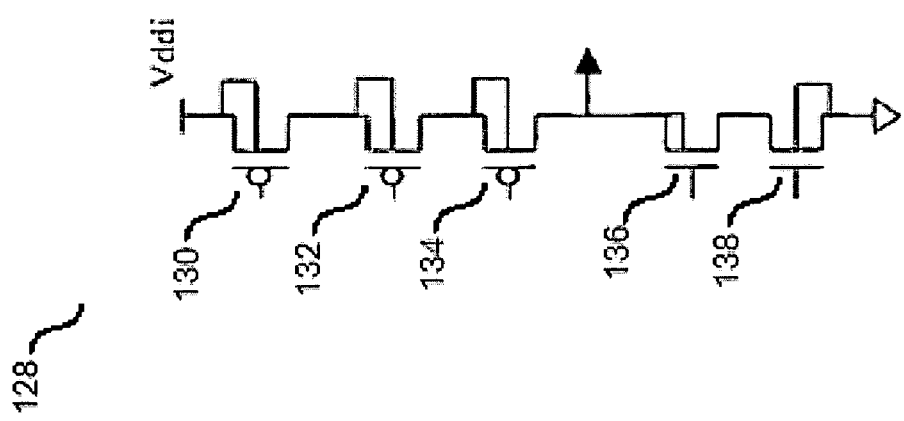

FIG. 1C illustrates an I/O driver 128 with thin-oxide devices in accordance with another embodiment of the present invention. Thin-oxide PMOS transistors 130, 132, and 134 are placed in a pull-up module, while a NMOS transistor 136 in series with another NMOS transistor 138 are placed in a pull-down module. This configuration allows the drain of the transistor 136 to be able to sustain a higher voltage so that the source can be clamped at a lower voltage. The backgate bias of the transistor 136 can be set to be very low such that this device does not need to be on a separate P-well. With this high voltage device implemented, it allows the PMOS transistors to be used in the pull-up module without an additional NMOS transistor in the pull-down module as shown in FIG. 1B.

The PMOS transistors used in the I/O drivers as shown in FIGS. 1A through 1C are controlled by the differential biases so that the voltage difference across each transistor would not exceed a predetermined value. This allows the transistor to be made of thin-oxide layers, without damage caused by the high I/O voltage.

Figure 2A:
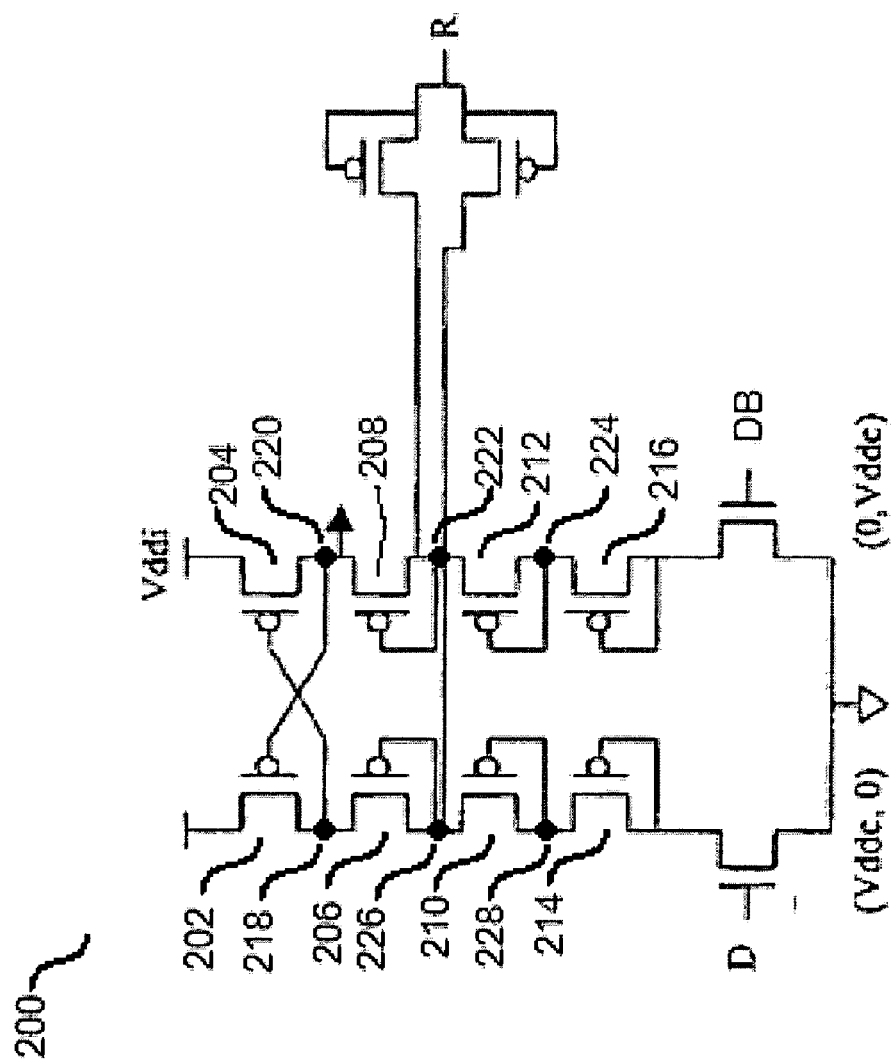
FIGS. 2A and 2B illustrate two level shifters in accordance with another embodiment of the present invention.

FIG. 2A illustrates a level shifter 200 for generating the differential biases in accordance with one embodiment of the present invention. The level shifter 200 can generate the differential biases for proper clamping of the transistors within the I/O drivers 100, 112, and 128 as shown in FIGS. 1A through 1C. A PMOS transistor 202 coupled to an I/O power supply having the I/O voltage VDDI. One or more voltage dropping PMOS transistors 206, 210 and 214, each of which having its gate connected to its drain, are serially coupled to the drain of the transistor 202. An NMOS transistor, having a gate controlled by an input signal D, is serially coupled between the transistor 214 and ground. A PMOS transistor 204 is coupled to the I/O power supply in parallel to the transistor 202. The gate of the transistor 204 is coupled to the drain of the transistor 202, and the gate of the transistor 202 is coupled to the drain of the transistor 204. One or more voltage dropping PMOS transistors 208, 212 and 216, each of which having its gate connected to its drain, are serially coupled to the drain of the transistor 204. An NMOS transistor is serially coupled between the transistor 216 and ground, having a gate controlled by a complementary input signal DB.

The PMOS transistors 202 and 204 form a cross-coupled structure that can latch data when input signals D and DB are switching. It is understood that the complementary input signal DB is the inverse of the input signal D. The PMOS transistors 206, 210, and 214 are arranged in a diode configuration, while the PMOS transistors 208, 212, and 216 are arranged in another diode configuration to provide multiple voltage drops. It is understood that at nodes 218 and 220, two leakers can help prevent voltages from dropping to ground when either the transistor 202 or 204 is cut off.

Three different kinds of biases can be extracted from the level shifter 200. The node 220, as well as nodes 222 and 224 can provide biases for clamping with the same polarity as the input signal D, while the node 218, as well as nodes 226 and 228 can provide biases for clamping with the reversed polarity as the input signal DB. A pair of PMOS transistors, having their gates coupled to their drains and receiving outputs from nodes 222 and 226, provide a fixed bias R. Other nodes provide swing biases depending on the switch from the input signal D to the complementary input signal DB.

It is understood that the PMOS transistors 206, 208, 210, 212, 214 and 216 can be NMOS diodes, PMOS diodes, NMOS transistors, P-N junction diodes, or the combination thereof. If a NMOS transistor is connected as a diode, its gate is connected to its drain. Similarly, if a PMOS transistor is connected as a diode, its gate is connected to its drain.

Figure 2B:
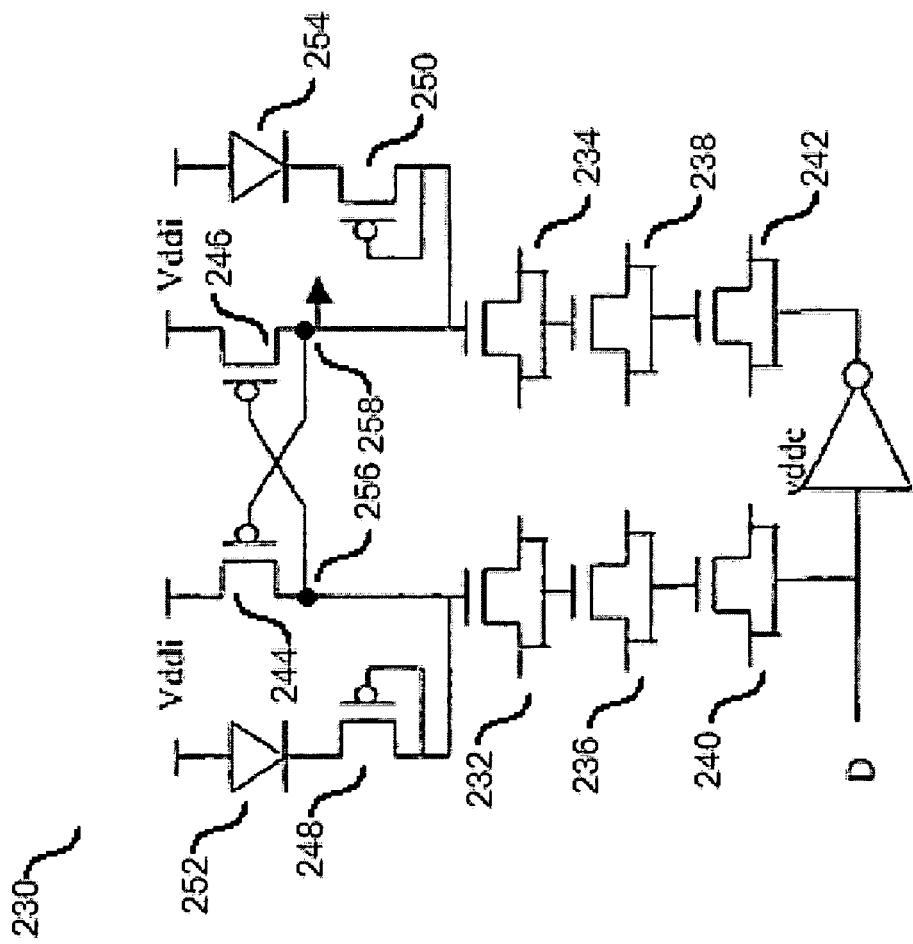

FIG. 2B illustrates a level shifter 230 for generating the differential biases in accordance with another embodiment of the present invention. A PMOS transistor 244 is coupled to the I/O power supply with an I/O voltage VDDI. One or more capacitors 232, 236 and 240 are serially coupled to the drain of the PMOS transistor 244 for receiving an input signal D. A PMOS transistor 246 is coupled to the I/O power supply in parallel to the PMOS transistor 244. The gate of the transistor 246 is coupled to the drain of the transistor 244, and the gate of the transistor 244 is coupled to the drain of the transistor 246. One or more capacitors 234, 238 and 242 are serially coupled to the drain of the transistor 246 for receiving a complement of the input signal D.

A diode 252 is coupled to the I/O power supply in parallel to the transistor 244. A PMOS transistor 248 is serially coupled to the diode 252, and having a gate connected to its drain, which is further coupled to the drain of the transistor 244. A second diode 254 is coupled to the I/O power supply in parallel to the transistor 246. A PMOS transistor 250 is serially coupled to the diode 254, and having a gate connected to its drain, which is further coupled to the drain of the transistor 246.

It is understood that this level shifter 230 can generate the differential biases for proper clamping of transistors within I/O drivers shown in FIGS. 1A, 1B, and 1C. The level shifter 230 is a bootstrap level shifter composed of six bootstrap NMOS capacitors 232, 234, 236, 238, 240, and 242, which can be seen as capacitance devices providing an arbitrary capacitance value for determining the biases. The NMOS capacitors 232, 236, and 240 in a stack formation can be seen as a bootstrap module and the NMOS capacitors 234, 238, and 242 in a stack formation can be seen as another bootstrap module. An input signal D switches from low to high or high to low, while a node 256 will be coupled high or low accordingly. The combination of the transistors 244 and 246 form a cross-coupled structure for latching a signal. The diode 252 or 254 works along with the transistor 248 or 250 to provide a leakage path if either the node 256 or 258 is floating. As such, the node 258 or 256 outputs a bias that controls the I/O derivers in response to the input signal D.

The level shifter 230 has several advantages. The level shifter 230 can perform faster while allowing the bias to be generated arbitrarily depending on capacitance ratios which is easier than counting on fixed threshold voltages. There is also no temperature dependence during generation of bias. Furthermore, the level shifter 230 puts less oxide stress on devices and has less leakage. All MOS capacitors also share the same bulks, meaning it will take up less area.

It is understood that the MOS devices shown in FIG. 2B can be zero-Vt devices, depletion devices, N+ on N-bulk MOS capacitors, or P+ on P-bulk MOS capacitors.

Figure 3:
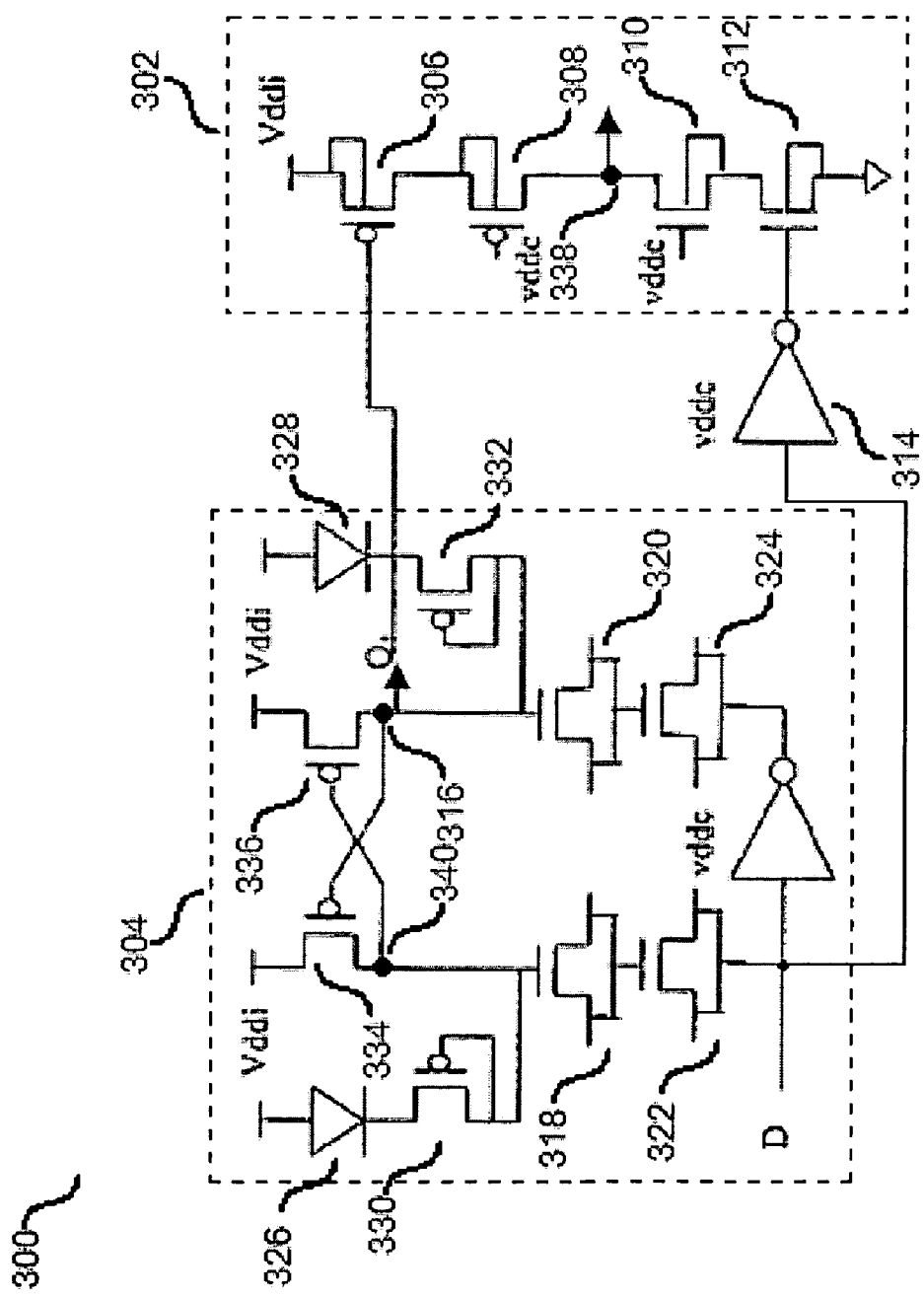
FIG. 3 illustrates a circuit with an I/O driver controlled by a set of differential biases generated by a level shifter (FIGS. 2A or 2B) in accordance with another embodiment of the present invention.

FIG. 3 illustrates a circuit 300 with an I/O driver 302 biased by a level shifter 304 in accordance with one embodiment of the present invention. The I/O driver 302 is equivalent to the I/O driver 100 shown in FIG. 1A, with one of its thin-oxide devices biased by the level shifter 304. The level shifter 304 operates in the same way as the level shifter 230 shown in FIG. 2B, except that it has one less NMOS capacitor.

Thin-oxide PMOS transistors 306 and 308 are placed in a pull-up module along with thin-oxide NMOS transistors 310 and 312 in a pull-down module. Both the gates of the transistors 308 and 310 are clamped to core voltage VDDC while the gate of the transistor 312 can be driven by an inverter 314, thereby allowing it to swing between 0 volts to core voltage VDDC. The gate of the transistor 306 is biased by a voltage at a node 316 of the level shifter 304, thereby allowing it to switch between a high voltage value and a low voltage value, depending on the changing value of input signal D.

The level shifter 304 operates similarly to the bootstrap level shifter 230 of FIG. 2B. In the level shifter 304, capacitors 318, 320, 322, and 324 are charged to VDDI−VDDC initially through the leakers composed of diodes 326 and 328 and PMOS transistors 330 and 332. If an input signal D is set to low, a PMOS transistor 334 is turned off, while a PMOS transistor 336 is turned on, thereby allowing high voltage VDDI to reach the node 316, thereby turning off the transistor 306. Meanwhile, the input signal D also drives the inverter 314 and turns on the transistor 312 of the I/O driver 304. With the transistor 306 turned off and the transistor 312 turned on, the output voltage at a node 338 is 0V. When the input signal D is switching from low to high, a node 340 is bootstrapped to high and equal to VDDI. The node 316 will be coupled low, equaling to VDDC. The voltage at the node 316 will then be sufficient to turn on the transistor 306 such that the node 338 of the I/O driver 304 can be pulled high.

According to the embodiments of the invention, multiple thin-oxide devices can be placed in a cascade formation where each device is controlled by a proper bias provided by level shifters. The bias voltage at the gate of each thin-oxide devices allows them to operate under higher voltage without sustaining high voltage damage. This makes high voltage I/O driver implemented with only thin-oxide devices possible, thereby removing the need of additional masks for thick-oxide devices and thus saving cost and fabrication time.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An input/output (I/O) circuit for outputting an output signal of a first voltage in response to an input signal of a second voltage lower than the first voltage, comprising:
    a pull-down module having one or more NMOS transistors serially coupled between ground and an output node;
    a pull-up module having one or more PMOS transistors serially coupled between an I/O voltage and the output node; and a level shifter responsive to the input signal for generating a set of differential biases selectively enabling or disabling the pull-down and pull-up models to pull the output node to the I/O voltage or ground, wherein the differential biases are separately set for each of the PMOS transistors so that a voltage difference across each of the PMOS transistors does not exceed a predetermined value, thereby preventing the same from damage, wherein the level shifter further comprises:

a first PMOS transistor coupled to the I/O voltage;

a first group of one or more voltage dropping PMOS transistors each of which has its gate connected to its drain, serially coupled to a dram of the first PMOS transistor;

a first NMOS transistor serially coupled between the first group of the voltage dropping PMOS transistors and ground, having a gate controlled by the input signal;

a second PMOS transistor coupled to the I/O voltage in parallel to the first PMOS transistor, wherein the gate of the second PMOS transistor is coupled to the drain of the first PMOS transistor, and the gate of the first PMOS transistor is coupled to the drain of the second PMOS transistor;

a second group of one or more voltage dropping PMOS transistors each of which has its gate connected to its drain, serially coupled to a drain of the second PMOS transistor; and a second NMOS transistor serially coupled between the second group of voltage dropping PMOS transistors and ground, having a gate controlled by a complement of the input signal, wherein the drains of the first and second PMOS transistors and the first and second groups of the voltage dropping PMOS transistors provide the differential biases.

2. The I/O circuit of claim 1 wherein the level shifter further comprises:

a third PMOS transistor having its gate coupled to its drain; and a fourth PMOS transistor having its gate coupled to its drain, which is further coupled to the drain of the third PMOS transistor, wherein the third and fourth PMOS transistors receive a complementary pair of the differential biases from the drains of the first and second groups of the voltage dropping PMOS transistors, and output a fixed bias.

3. An input/output (I/O) circuit for outputting an output signal of a first voltage in response to an input signal of a second voltage lower than the first voltage, comprising:

a pull-down module having one or more NMOS transistors serially coupled between ground and an output node;

a pull-up module having one or more PMOS transistors serially coupled between an I/O voltage and the output node; and a level shifter responsive to the input signal for generating a set of differential biases selectively enabling or disabling the pull-down and pull-up models to pull the output node to the I/O voltage or ground, wherein the differential biases are separately set for each of the PMOS transistors so that a voltage difference across each of the PMOS transistors does not exceed a predetermined value, thereby preventing the same from damage, wherein the level shifter further comprises:

a first PMOS transistor coupled to the I/O voltage;

a first group of one or more capacitors serially coupled to a drain of the first PMOS transistor for receiving the input signal;

a second PMOS transistor coupled to the I/O voltage in parallel to the first PMOS transistor, wherein the gate of the second PMOS transistor is coupled to the drain of the first PMOS transistor and the gate of the first PMOS transistor is coupled to the drain of the second PMOS transistor; and a second group of one or more capacitors serially coupled to a drain of the second PMOS transistor for receiving a complement of the input signal wherein the drains of the first and second PMOS transistors provide the differential biases.

4. The I/O circuit of claim 3 wherein the level shifter further comprises:

a first diode coupled to the I/O voltage in parallel to the first PMOS transistor; and a third PMOS transistor serially coupled to the first diode, and having a gate connected to a drain of the same, which is further coupled to the dram of the first PMOS transistor.

5. The I/O circuit of claim 3 wherein the level shifter further comprises:

a second diode coupled to the I/O voltage in parallel to the second PMOS transistor; and a fourth PMOS transistor serially coupled to the second diode, and having a gate connected to a drain of the same, which is further coupled to the drain of the second PMOS transistor.

* * * * *

UNITED STATES PATENT AND TRADEMARK OFFICE
CERTIFICATE OF CORRECTION

PATENT NO. : 7,046,067 B2  Page 1 of 1
APPLICATION NO. : 11/127452
DATED : May 16, 2007
INVENTOR(S) : Shine Chien Chung It is certified that error appears in the above-identified patent and that said Letters Patent is hereby corrected as shown below:

Title page, item [75] Inventer name should read:

Shine Chien Chung

Signed and Sealed this

Fourteenth Day of August, 2007

JON W. DUDAS
*Director of the United States Patent and Trademark Office*

UNITED STATES PATENT AND TRADEMARK OFFICE
CERTIFICATE OF CORRECTION

PATENT NO. : 7,046,067 B2  Page 1 of 1
APPLICATION NO. : 11/127452
DATED : May 16, 2006
INVENTOR(S) : Shine Chien Chung It is certified that error appears in the above-identified patent and that said Letters Patent is hereby corrected as shown below:

Title page, item [75] Inventer name should read:

Shine Chien Chung

This certificate supersedes Certificate of Correction issued August 14, 2007.

Signed and Sealed this

Fourth Day of September, 2007

JON W. DUDAS
*Director of the United States Patent and Trademark Office*